(12) United States Patent
Tseng

(10) Patent No.: US 6,309,923 B1
(45) Date of Patent: *Oct. 30, 2001

(54) METHOD OF FORMING THE CAPACITOR IN DRAM

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/620,068

(22) Filed: Jul. 20, 2000

(51) Int. Cl.$^7$ .................. H01L 21/8242; H01L 21/20
(52) U.S. Cl. .................. 438/239; 438/255; 438/243; 438/398
(58) Field of Search .................. 434/253, 239, 434/255, 396, 398; 257/296, 309; 438/964, 242, 243, 386

(56) References Cited

U.S. PATENT DOCUMENTS

| | | | |
|---|---|---|---|
| Re. 36,786 | * 7/2000 | Fazan et al. | 438/253 |
| 5,447,878 | * 9/1995 | Park et al. | 437/52 |
| 6,027,981 | * 2/2000 | Wu | 438/396 |
| 6,218,242 | * 4/2001 | Tseng | 438/253 |
| 6,222,722 | * 4/2001 | Fukuzumi et al. | 361/305 |

* cited by examiner

Primary Examiner—Richard Elms
Assistant Examiner—Adam Pyonin
(74) Attorney, Agent, or Firm—Bacon & Thomas

(57) ABSTRACT

A method of forming a capacitor with a self-align structure on a substrate, the substrate including a word line and an active region, the method including the steps of forming a first dielectric layer on the active region and the word line with a planar top surface, creating a contact hole in the first dielectric layer with the self-align structure to expose portions of the active region and the word line, forming a conductive layer on the bottom of the contact hole, forming a polysilicon spacer on the sidewall of the contact hole, forming a dielectric spacer on the sidewall of the polysilicon spacer, filling the contact hole with a polysilicon bar, creating three sub-contact holes by etching back the polysilicon spacer and the polysilicon bar with part of the polysilicon spacer and the polysilicon bar remaining on the bottom, forming a hemispherical grain (HSG) layer on the surface of the sub-contact holes, depositing a second dielectric layer on the hemispherical grain, and forming a top electrode on the second dielectric layer.

19 Claims, 5 Drawing Sheets

METHOD OF FORMING THE CAPACITOR IN DRAM

FIELD OF THE INVENTION

The present invention generally relates to a method for forming a capacitor in DRAM, particularly relates to a method of forming a capacitor utilizing the self-align contact structure.

BACKGROUND OF THE INVENTION

As the semiconductor memory device becomes more highly integrated, to decrease the contact area is a possibility to contribute to the high integrated circuits. SAC (Self-Align Contact) method is one example. To shrink the area occupied by a capacitor of a DRAM storage cell is another possibility, however it will cause the capacitance reduce of the capacitor. Owing to the leakage current, it is necessary to refresh the capacitor continuously in order to keep the stored state, especially when the capacitance of the capacitor is limited. Furthermore, the area reduction of the capacitor occupied will cause the capacitor to be disturbed by the alpha particle more easily.

Until now, there has been much effort directed to keep a relatively large capacitance of the capacitors in order to achieve a high signal to noise ratio in reading the memory cell and to reduce soft errors (due to alpha particle interference) as the memory device becomes highly integrated. As the followings, there are some approaches to increase the storage capability of the capacitor while the area occupied by the capacitor maintains small enough. (1) substituting a high capacitance material for traditional material to increase the storage charges per unit area of the capacitor, for example: the substitution the of $Ta_2O_5$ and $TiO_2$ for $SiO_2$. (2) decreasing the dielectric layer thickness of the capacitor: because of the Fowler-Nordheimn tunneling effect, the dielectric layer thickness is limited to a minimum value and one can not improve the capacitor too much by this method. (3) variation the shape of the capacitor electrodes: the capacitor may have protrusions, cavities, etc., to increase the surface area of the capacitor electrode. (4) increasing the contact area between the conductive layer acting as the electrode of the capacitor and the dielectric layer: the surface between the dielectric layer and the conductive layer can be varied to a ragged type surface and not be even a plain surface anymore.

One type of increasing the contact area is a ragged polysilicon layer or hemispherical grain (HSG) polysilicon. The present invention concerns the issue of increasing the capacitance in self-align contact (SAC) structure, which utilize the aforementioned third and fourth approach.

SUMMARY OF THE INVENTION

The present invention provides a method for manufacturing capacitor in DRAM utilizing self-align contact structure.

In the present invention, two word line structures, active areas are provided on the substrate. First, a first dielectric layer is deposited on the active region and the word line with planar top surface. Next, a contact hole is created in the first dielectric layer to expose portions of said active region and said word line by using plasma etch process in consequence. Furthermore, a conductive layer is formed on the substrate and is etched back until the thickness within the range about 100 to 5000 angstroms.

Then, a polysilicon spacer with the width range about 50 to 2000 angstroms is formed on the sidewall of the contact hole, and a dielectric spacer with the width range about 100 to 2000 angstroms is formed on the sidewall of said polysilicon spacer. Afterward, the maining space of the contact hole is filled with a polysilicon bar and three sub-contact holes are created by etching back the polysilicon spacer and the polysilicon bar with part of the polysilicon spacer and said polysilicon bar remaining on the bottom. The polysilicon spacer and the polysilicon bar have the thickness range about 50 to 1000 angstroms. Next, a hemispherical grain (HSG) layer is formed on the surface of said sub-contact holes, and a second dielectric layer is dopesited on the hemispherical grain. Finally, a top electrode is formed on the second dielectric layer to complete the capacitor fabrication.

BRIEF DESCRIPTION OF THE DRAWINGS

The objects, features and advantages of the present invention will be apparent from the following more particularly description of the invention illustrated in the accompanying drawings, in which.

DETAILED DESCRIPTION OF THE PREFERRED EMBODIMENT

Figure 1:
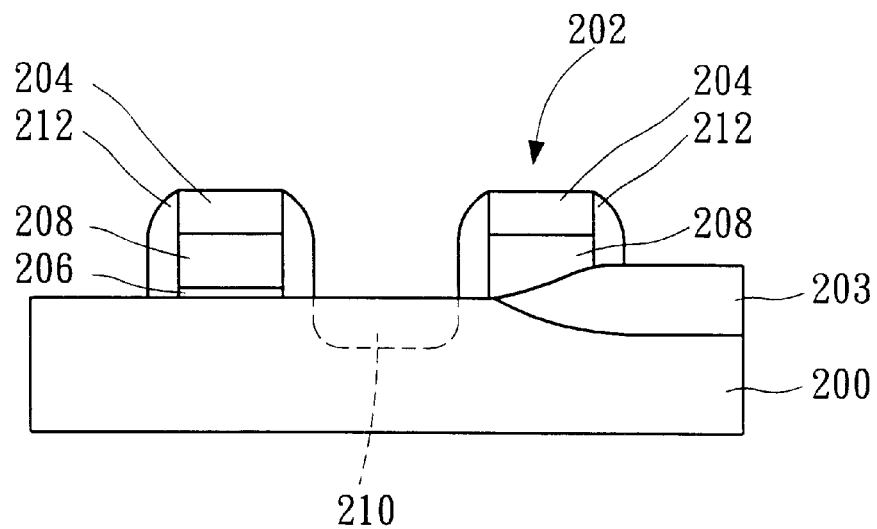
FIG. 1 is a cross section view illustrating the step where capacitor fabrication begins in the present invention.

Hereinafter, the preferred embodiments of the invention will be described with reference to accompanying drawing wherein like reference numerals designate like parts, respectively.

FIG. 1 is a cross section view illustrating the step where capacitor fabrication begins in the present invention. There are two word lines structure 202, active areas 210 and field oxide region 203 on the substrate 200. The active areas 210 is isolated from other active areas in a DRAM array by a field oxide region 203, and one of the word line structure 202 is positioned over field oxide region 203.

As shown in FIG. 1, the word line structure 202 comprises a oxide layer 206, a first polysilicon layer 208 formed on the oxide layer 206, a protection cap layer 204 formed on the first polysilicon layer 208 and a pair of sidewall spacer 212 formed vertically along the side word of the word line structure 202. The sidewall spacer 212 and protection cap layer 204 is silicon nitride or silicon dioxide material, and are used to protect the word line structure 202 from any etching process or act as a shield to prevent dopants atoms entering the channel region. Furthermore, during the operation of the DRAM, the spacer 212 and protection cap layer 204 provide electrical isolation between the gate electrode 202 and the active area 210. The first polysilicon layer 208 can be substituted with metal material, like tungsten silicide.

Figure 2:
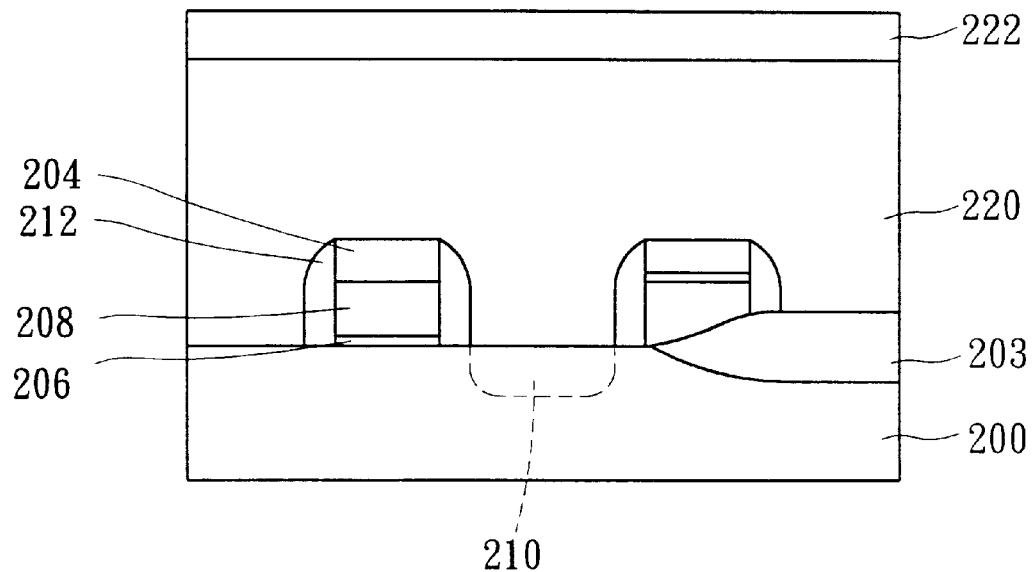
FIG. 2 which is a cross sectional view of a semiconductor substrate illustrates the steps of forming a first dielectric layer 220 and a photoresist layer 222 in the present invention.

FIG. 2 which is a cross sectional view of a semiconductor substrate illustrates the steps of forming a first dielectric layer 220 and a photoresist layer 222 in the present invention. A first dielectric layer 220, preferably comprising borophosphosilicate glass (BPSG), is deposited on the substrate 200 in FIG. 1. Following the first dielectric layer 220 deposition, a photoresist layer 222 is deposited on the first dielectric layer 220.

Figure 3:
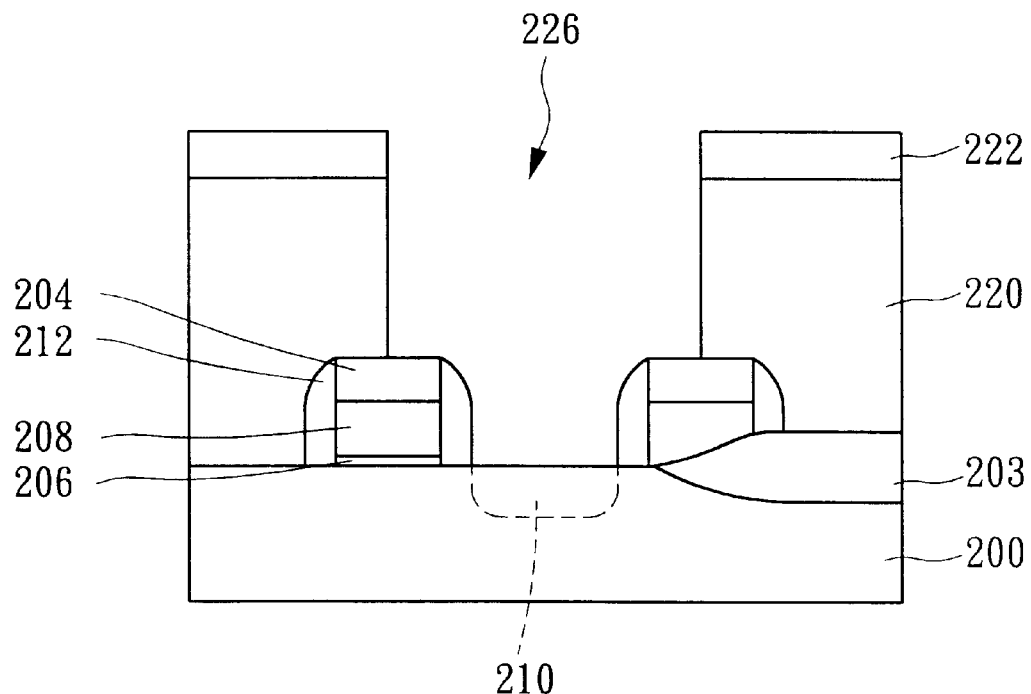
FIG. 3, which is a cross sectional view of a semiconductor substrate, illustrates the step of forming a contact hole 226 in the present invention.

Referring to FIG. 3, which is a cross sectional view of a semiconductor substrate, illustrates the step of forming a contact hole 226 in the present invention. The photoresist layer 222 is patterned using photolithography process to create a contact hole 226 in the photoresist layer 222. Next, the first dielectric layer 220 is etched by using the patterned photolithography layer 222 and as a masking layer, and the contact hole 226 is created in the first dielectric layer 220.

Figure 4:
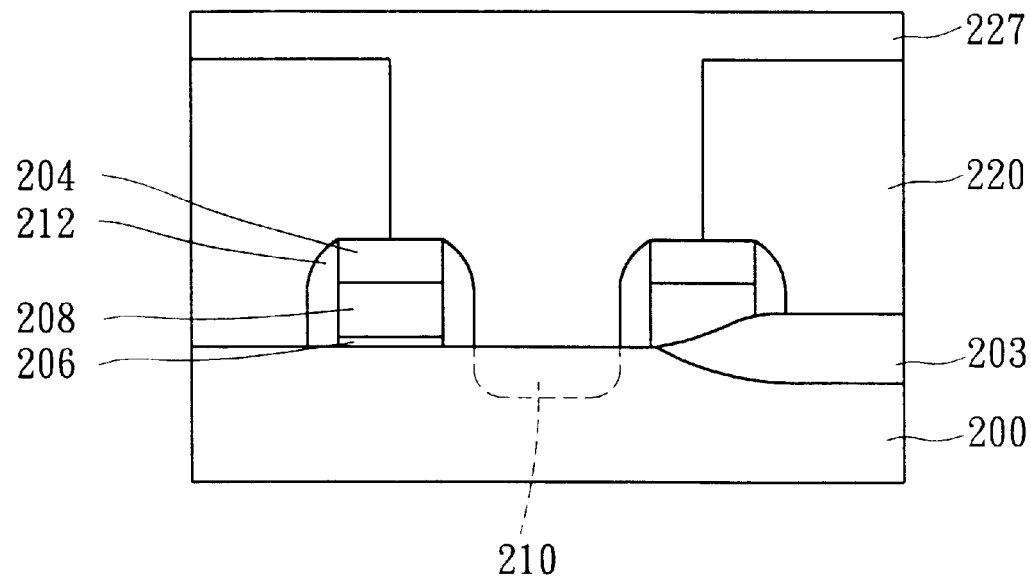
FIG. 4 which is a cross sectional view of a semiconductor substrate illustrates the steps of forming a second polysilicon layer 227 in the present invention.

FIG. 4 which is a cross sectional view of a semiconductor substrate illustrates the steps of forming a second polysilicon layer 227. The remaining photoresist layer 222 is removed by dry etching process. Then, a second polysilicon layer 227 is formed in the contact hole 226 and on the top surface of the first dielectric layer 220. The second polysilicon layer 227 can be an amorphous silicon layer. In the preferred embodiments, the second polysilicon layer 227 is a doped polysilicon layer, for example, using a standard chemical vapor deposition (CVD) process with in-situ doped dopants.

Figure 5:
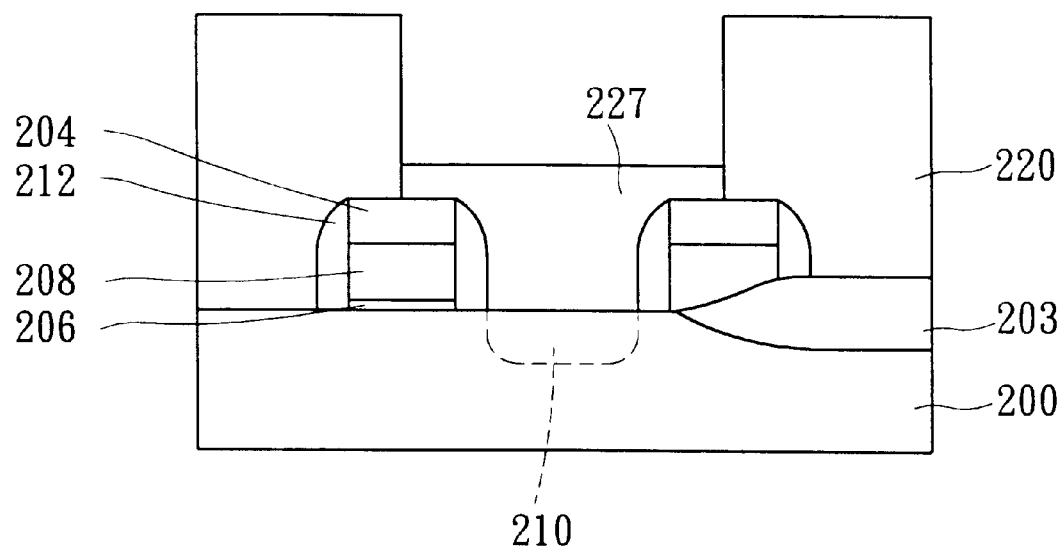
FIG. 5 which is a cross sectional view of a semiconductor substrate illustrates the steps of etching the second polysilicon layer 227 in the present invention.

FIG. 5 which is a cross sectional view of a semiconductor substrate illustrates the steps of etching the second polysilicon layer 227. The second polysilicon layer 227 is etched back using plasma dry etching process until the thickness of the second polysilicon layer 227 is about 100 to 5000 angstroms.

Figure 6:
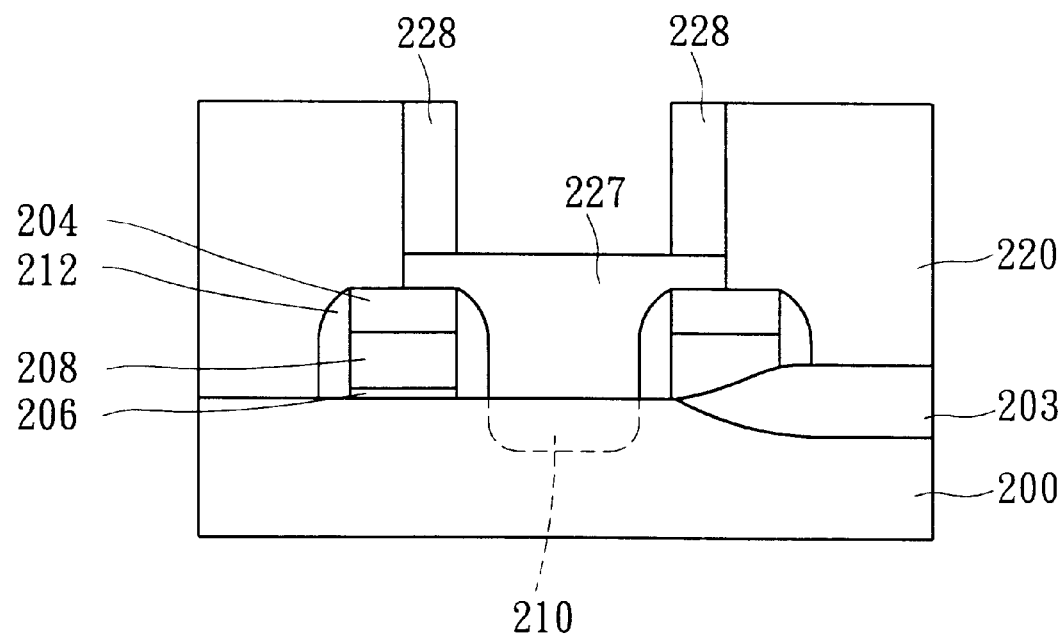
FIG. 6 which is a cross sectional view of a semiconductor substrate illustrates the steps of forming the polysilicon spacer 228 in the present invention.

FIG. 6 which is a cross sectional view of a semiconductor substrate illustrates the steps of forming the polysilicon spacer 228. A polysilicon layer 228 is deposited on the substrate 200 and is etched with dry etching process. A pair of polysilicon spacer 228 with the width about 50 to 2000 angstroms is formed on the sidewall of the contact hole 226.

Figure 7:
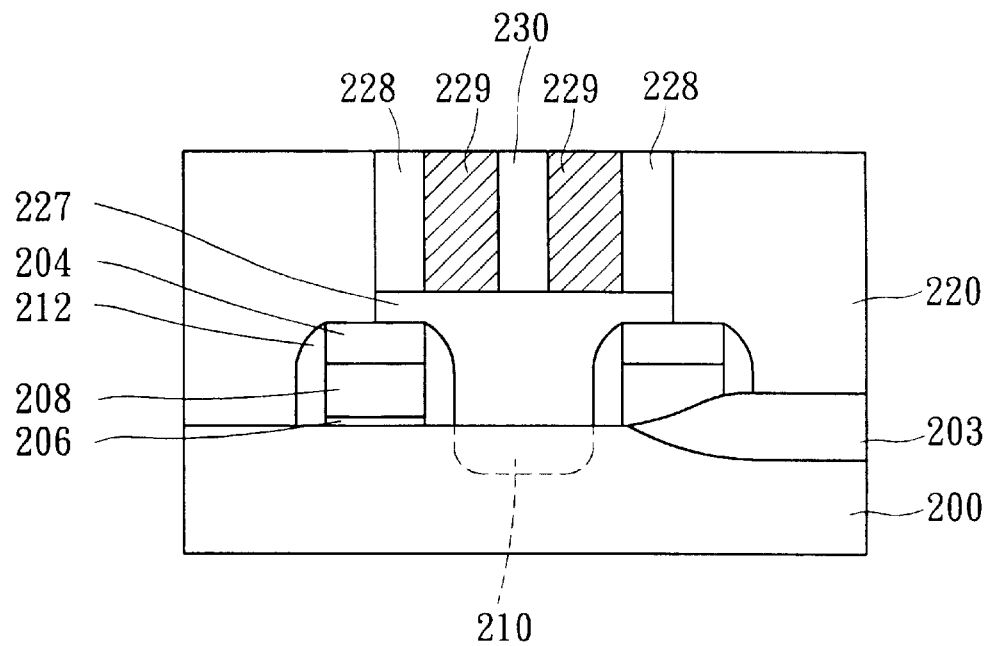
FIG. 7 which is a cross sectional view of a semiconductor substrate illustrates the steps of forming the dielectric spacer 229 and polysilicon bar 230 in the present invention.

FIG. 7 which is a cross sectional view of a semiconductor substrate illustrates the steps of forming the dielectric spacer 229 and polysilicon bar 230. A dielectric layer 229 is deposited on the substrate 200 and is etched with dry etching process. A pair of dielectric spacer 229 with the width about 100 to 2000 angstroms is formed on the sidewall of the polysilicon spacer 228. Next, a polysilicon layer 230 is deposited on the substrate 200 and fills the contact hole 226. Then the substrate 200 is processed with CMP to provide a planar top surface of the substrate 200. A polysilicon bar 230 with the width about 50 to 2000 angstroms is formed on the sidewall of the dielectric spacer 229.

Figure 8:
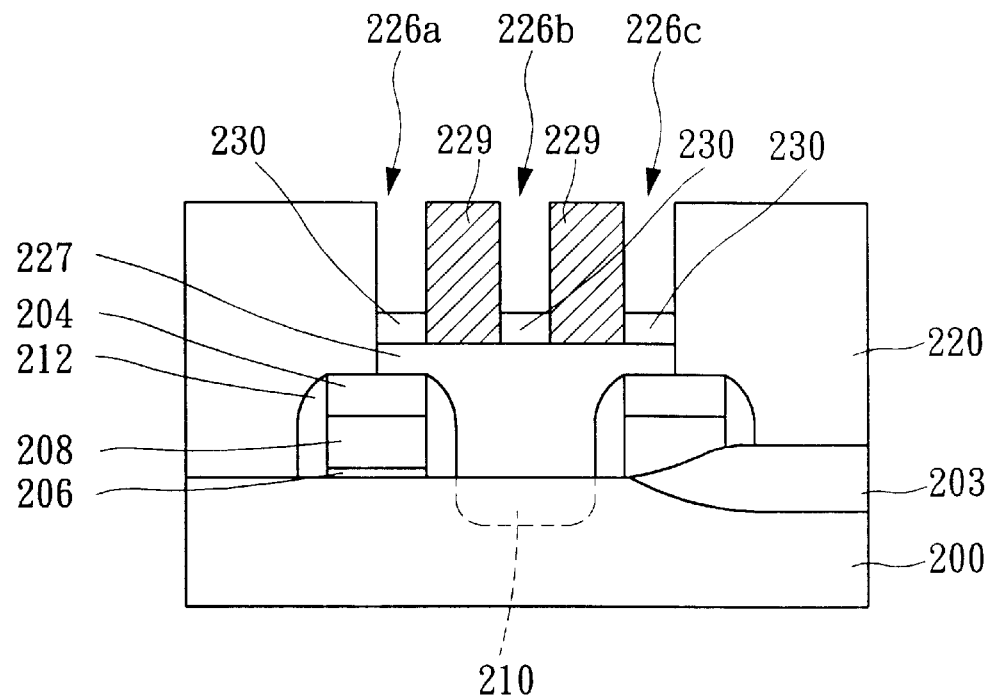
FIG. 8 which is a cross sectional view of a semiconductor substrate illustrates the steps of etching the polysilicon spacer 228 and polysilicon bar 230 in the present invention.

FIG. 8 which is a cross sectional view of a semiconductor substrate illustrates the steps of etching the polysilicon spacer 228 and polysilicon bar 230. The polysilicon spacer 228 and polysilicon bar 230 are etched back using plasma etching process until the thickness of the polysilicon spacer 228 and polysilicon bar 230 is about 50 to 1000 angstrom. And three contact hole 226a, 226b and 226c are created in the substrate.

Figure 9:
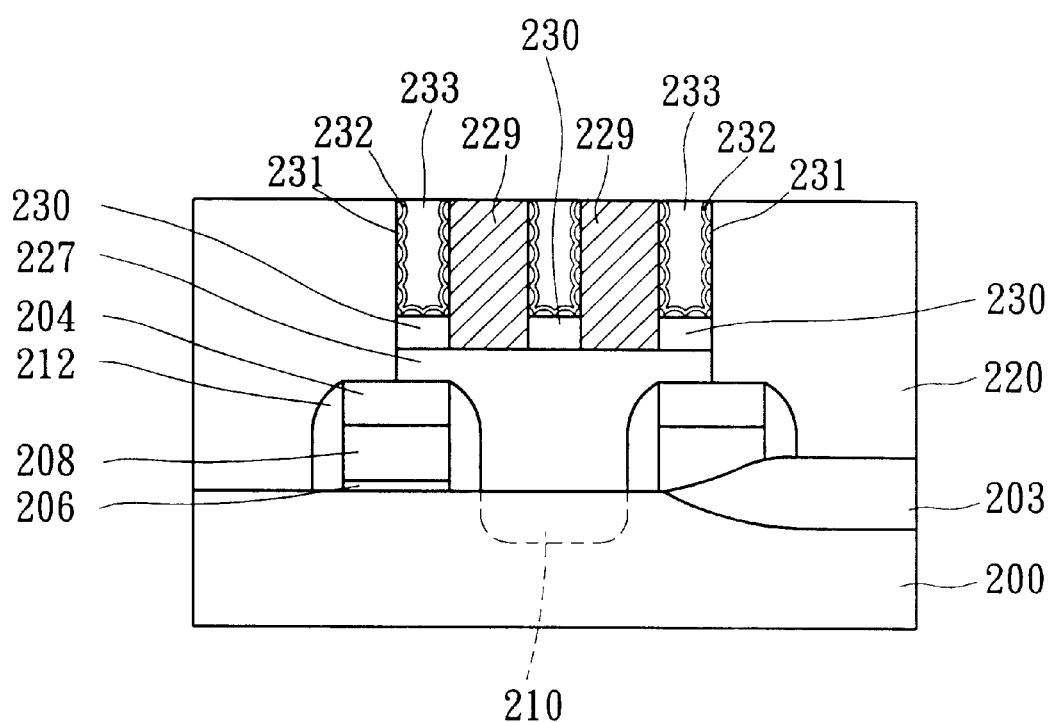
FIG. 9 which is a cross sectional view of a semiconductor substrate, illustrates the step of forming a HSG layer 231 and a second dielectric layer 232 on the surface of the contact hole 226a, 226b and 226c and on the upper surface of the substrate 200 in the present invention.

Referring to FIG. 9, a HSG layer 231 is formed on the surface of the contact hole 226a, 226b and 226c and on the upper surface of the substrate 200. The HSG layer 231, which is preferably an doped silicon layer, forms size with the thickness ranging from about 10 to 500 angstroms in the case.

In the preferred embodiments of forming HSG layer 231, a seed layer may be needed for the formation of grain silicon. A thin titanium nitride (TiN) layer can be conformably deposited with suitable processes. In this embodiment, a low pressure chemical vapor deposition (LPCVD) is preferably used to achieve excellent conformity and thickness controllability. The TiN layer is preferably deposited to a thickness between about 100 to 300 angstroms. Having the TiN layer as a seed layer, the nucleation sites in forming the HSG layer 231 are provided.

Referring to FIG. 9, the substrate 200 is process with CMP (chemical mechanical planarization). The HSG polysilicon layer 231 on the top surface of the substrate 200 is removed. Following the CMP step, a second dielectric layer 231 is formed conformably on the substrate 200. The second dielectric layer 231 is the inter-electrode dielectric film of the capacitor that is to be fabricated. In the preferred embodiment of the present, the second dielectric layer 231 is the dielectric film of the capacitor can be stacked oxide-nitride-oxide (ONO) film, silicon nitride, $Ta_2O_5$, $TiO_2$, BST ($BaSiTiO_3$), PZT (lead zirconate titanate) and the thickness is about 10 to 1000 angstroms. Then, a conductive layer 233, acting as the upper electrode of the capacitor, is formed over the second dielectric layer 232. The preferred embodiment according to the present invention, the conductive layer 233 can be polysilicon, tungsten or aluminum.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed is:

1. A method of forming a capacitor with a self-align structure on a substrate, said substrate comprising two word lines and an active region, said method comprising the steps of:

forming a first dielectric layer on said active region and said word line with a planar top surface;

creating a contact hole in said first dielectric layer and said self-align structure to expose portions of said active region and said word line;

forming a conductive layer on a bottom of said contact hole;

forming a polysilicon spacer on a sidewall of said contact hole;

forming a dielectric spacer on a sidewall of said polysilicon spacer;

filling said contact hole with a polysilicon bar;

creating three sub-contact holes by etching back said polysilicon spacer and said polysilicon bar with part of said polysilicon spacer and said polysilicon bar remaining on the bottom of said sub-contact holes;

forming a hemispherical grain (HSG) layer on the surface of said sub-contact holes;

depositing a second dielectric layer on said hemispherical grain; and forming a top electrode on said second dielectric layer.

2. The method according to claim 1, wherein said conductive layer has the thickness range about 100 to 5000 angstrom.

3. The method according to claim 1, wherein said conductive layer is doped polysilicon layer.

4. The method according to claim 1, wherein said polysilicon spacer has the thickness range about 50 to 2000 angstroms after creating three sub-contact holes step.

5. The method according to claim 1, wherein said dielectric spacer has the width range about 100 to 2000 angstroms.

6. The method according to claim 1, wherein said polysilicon bar has the thickness range about 50 to 1000 angstroms after creating three sub-contact holes step.

7. The method according to claim 1, wherein said HSG layer has the thickness range about 10 to 500 angstroms.

8. The method according to claim 1, wherein said first dielectric layer is BPSG layer.

9. The method according to claim 1, wherein said second dielectric layer comprises a material selected from the group consisting of stacked oxide-nitride-oxide (ONO) film and silicon nitride.

10. The method according to claim 1, wherein said dielectric layer comprises a material selected from the group consisting of stacked $Ta_2O_5$ and $TiO_2$.

11. The method according to claim 1, wherein said dielectric layer comprises a material selected from the group consisting of stacked BST (BaSiTiO3) and PZT (lead zirconate titanate).

12. A method of forming a capacitor on a substrate with a self-align structure, said self-align structure comprising two word lines and an active region located between said word lines and a contact hole exposing portions of said active region and said word line, said method comprising the steps of:

forming a conductive layer with a thickness of about 100 to 5000 angstroms on a bottom of said contact hole;

forming a polysilicon spacer on a sidewall of said contact hole;

forming a dielectric spacer with a width range of about 100 to 2000 angstroms on a sidewall of said polysilicon spacer;

filling said contact hole with a polysilicon bar;

creating three sub-contact holes by etching back said polysilicon spacer and said polysilicon bar with part of said polysilicon spacer and said polysilicon bar remaining on the bottom;

forming a hemispherical grain (HSG) layer on the surface of said sub-contact holes;

depositing a dielectric layer on said hemispherical grain; and forming a top electrode on said dielectric layer.

13. The method according to claim 12, wherein said conductive layer is doped polysilicon layer.

14. The method according to claim 12, wherein said polysilicon spacer has the thickness range about 500 to 2000 angstroms after creating three sub-contact holes step.

15. The method according to claim 12, wherein said polysilicon bar has the thickness range about 50 to 1000 angstroms after creating three sub-contact holes step.

16. The method according to claim 12, wherein said HSG layer has the thickness range about 10 to 500 angstroms.

17. The method according to claim 12, wherein said dielectric layer comprises a material selected from the group consisting of stacked oxide-nitride-oxide (ONO) film and silicon nitride.

18. The method according to claim 12, wherein said dielectric layer comprises a material selected from the group consisting of stacked $Ta_2O_5$ and $TiO_2$.

19. The method according to claim 12, wherein said dielectric layer comprises a material selected from the group consisting of stacked BST ($BaSiTiO_3$) and PZT (lead zirconate titanate).

* * * * *